United States Patent
Sung et al.

(10) Patent No.: US 9,541,256 B2
(45) Date of Patent: Jan. 10, 2017

(54) LIGHT CONVERSION FILM, AND BACKLIGHT UNIT AND DISPLAY DEVICE HAVING THE SAME

(71) Applicant: LG ELECTRONICS INC., Seoul (KR)

(72) Inventors: Jinwoo Sung, Seoul (KR); Jinmok Oh, Seoul (KR); Byoungkwon Cho, Seoul (KR); Moongoo Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/675,181

(22) Filed: Mar. 31, 2015

(65) Prior Publication Data
US 2016/0161088 A1 Jun. 9, 2016

(30) Foreign Application Priority Data
Dec. 9, 2014 (KR) .................. 10-2014-0175572

(51) Int. Cl.
*F21V 9/16* (2006.01)
*H01L 33/50* (2010.01)
*F21Y 113/00* (2016.01)

(52) U.S. Cl.
CPC ............... *F21V 9/16* (2013.01); *H01L 33/502* (2013.01); *F21Y 2113/005* (2013.01)

(58) Field of Classification Search
None
See application file for complete search history.

(56) References Cited

U.S. PATENT DOCUMENTS

| | | | |
|---|---|---|---|
| 9,158,149 B2 | 10/2015 | Jung et al. | |
| 2008/0246388 A1* | 10/2008 | Cheon et al. | 313/501 |
| 2010/0298504 A1* | 11/2010 | Janczewski et al. | 525/418 |
| 2012/0156436 A1 | 6/2012 | Kim et al. | |
| 2012/0195340 A1* | 8/2012 | Cheon et al. | 372/50.1 |
| 2013/0265522 A1 | 10/2013 | Jung et al. | |
| 2013/0293123 A1* | 11/2013 | Deak et al. | 315/186 |
| 2014/0071381 A1* | 3/2014 | Jang et al. | 349/64 |
| 2015/0286094 A1 | 10/2015 | Jung et al. | |
| 2015/0308658 A1 | 10/2015 | Shin et al. | |

FOREIGN PATENT DOCUMENTS

| | | |
|---|---|---|
| CN | 103408984 A | 11/2013 |
| KR | 10-2012-0139127 A | 12/2012 |
| KR | 20130112990 A | 10/2013 |
| KR | 10-2014-0094806 A | 7/2014 |
| KR | 101463416 B1 | 11/2014 |

OTHER PUBLICATIONS

Summary and translation of CN 101864313 to Zhu et al.*

* cited by examiner

*Primary Examiner* — Anh Mai
*Assistant Examiner* — Zachary J Snyder
(74) *Attorney, Agent, or Firm* — Birch, Stewart, Kolasch & Birch, LLP (57) ABSTRACT

A light conversion film including a first barrier film, a light conversion layer disposed on the first barrier film, the light conversion layer including a matrix resin and red quantum dots that are dispersed into the matrix resin, and a second barrier film disposed on the light conversion layer. The light conversion film satisfies following Equation (1): $5 \leq$ (weight of quantum dot within light conversion layer/total weight of light conversion layer)$\times 100 \times t \leq 50$, where, t is a thickness of the light conversion layer.

28 Claims, 4 Drawing Sheets

LIGHT CONVERSION FILM, AND BACKLIGHT UNIT AND DISPLAY DEVICE HAVING THE SAME

CROSS-REFERENCE TO RELATED APPLICATIONS

This application claims the benefit of Korean Patent Application No. 10-2014-0175572, filed on Dec. 9, 2014, which is hereby incorporated by reference in its entirety into this application.

BACKGROUND OF THE INVENTION

Field of the Invention

The present disclosure relates to a light conversion film, and a backlight unit and display device having the same, and more particularly, to a light conversion film having superior light conversion efficiency and color characteristics and having a slim shape, and a backlight unit and display device having the same.

Discussion of the Related Art

Liquid Crystal Displays (LCDs) have low power consumption, good portability, technology compactness, and high added-value. In particular, LCDs are non-emissive type devices and thus do not form an image by itself. Also, because LEDs must receive light incident from the outside to form an image, a light source for providing light is required.

In addition, Cathode Fluorescent Lamps (CCFLs) have been mainly used as light sources in the past. However, CCFLs have a difficulty in securing of brightness uniformity and are deteriorated in color purity if the CCFLs are manufactured in large scale.

Thus, three-color light emitting diodes (LEDs) instead of the CCFLs are being used in recent years as light sources. When three-color LEDs are used, a high color purity can be used to form high-quality images. However, because three-color LEDs are expensive, the manufacturing costs increase. As a result, blue LEDs that are relatively inexpensive are being used as light sources. For this, the blue light is converted into red light and green light using a light conversion film including red quantum dots and green quantum dots. White light can also be produced.

In particular, light emitted from a corresponding blue LED is excited by the red quantum dot and green quantum dot within the light conversion member and thus is converted into red light and green light. Here, blue light that is not excited by the quantum dots can be mixed with the red light and green light to produce white light.

In addition, the light conversion member can be manufactured in a tube shape and disposed on a side surface of a light source unit. However, in this instance, the density of light incident into the quantum dots may increase causing the quantum dot to degrade. Thus, quantum dots can be dispersed into a matrix resin and then cured to prepare a light conversion member in the form of a film.

The light conversion member can then be disposed on a light guide plate. In this instance, because light incident from a light source is low in density, the degradation of the quantum dots can be reduced. However, an amount of quantum dots used for realizing white light increases. Particularly, an amount of green quantum dots increases.

In more detail, green light excited from the green quantum dots is excited again by the red quantum dots and thus converted into red light. Thus, to uniformly maintain rates of the green and red lights generated in the light conversion member, an amount of green quantum dots within the light conversion member is relatively larger than that of red quantum dots. In general, the amount of green quantum dots is about ten times greater than that of red quantum dots in the related art light conversion film.

In addition, when the amount of quantum dots within the film increases, a distance between the quantum dots decreases, which causes reabsorption of the quantum dots, thereby deteriorating the light emitting efficiency. To maintain the distance between the quantum dots, the film has an increased thickness. However, if the film thickness increases, an amount of light absorbed by the matrix resin increases, which deteriorates the light efficiency. In addition, the energy needed for curing the matrix resin increases in both process time and cost. Also, when the film is formed, the matrix resin may not be completely cured or is deteriorated in adhesion and/or physical property.

SUMMARY OF THE INVENTION

Accordingly, one aspect of the present invention is to provide a slim light conversion film using only red quantum dots without using green quantum dots, thereby reducing an amount of quantum dots.

Another aspect of the present invention is to provide a light conversion film having superior light efficiency and color characteristic.

Yet another aspect of the present invention is to provide a backlight unit and display device using the light conversion film.

To achieve these and other advantages and in accordance with the purpose of the present invention, as embodied and broadly described herein, the present invention provides in one aspect a light conversion film comprising a first barrier film; a light conversion layer disposed on the first barrier film, the light conversion layer comprising a matrix resin and red quantum dots dispersed into the matrix resin; and a second barrier film disposed on the light conversion layer, wherein the light conversion film satisfies the following Equation (1): Equation (1): $5 \leq$ (weight of quantum dot within light conversion layer/total weight of light conversion layer)$\times 100 \times t \leq 50$, where t is a thickness of the light conversion layer. The present invention also provides a corresponding backlight unit and display device.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Hereinafter, it will be described about an embodiment of the present invention in conjunction with the accompanying drawings. However, the following embodiments are provided so that this disclosure will fully convey the spirit of the present disclosure to those skilled in the art and also are not construed as being limited to the embodiments set forth herein or drawing. The inventive concept may, however, be embodied in different forms and should not be construed as limited to the embodiments set forth herein.

Since a shape, a ratio, an angle, a number, etc., which are shown in the accompanying drawings are exemplarily illustrated, the present disclosure is not limited thereto. Like reference numerals refer to like elements throughout. When 'comprising', 'having', 'consisting of', etc. are used, other components can be added unless 'only' is used. Even when a component is explained in singular number they may be interpreted as plural number. When positional relation of two portions is explained by 'on', 'upper', 'lower', 'beside', etc., one or more components may be positioned between two portions. When portions are connected by 'or', the portions are interpreted as including 'alone' as well as 'combination thereof' but when portions are connected by 'or', 'one of', portions are interpreted as 'alone'.

Even though terms such as 'after', 'before', 'next to', 'and', 'herein', 'subsequent to', 'at this time', etc. are used, they are not used as limiting temporal position. Although the terms of first and second are used herein to describe various elements, these elements should not be limited by these terms. These terms are only used to distinguish one component from another component. Accordingly, a first component that will be described below may be a second component within the technical idea of the present disclosure.

Features of various embodiments of the present disclosure are partially or entirely coupled or combined with each other, and technically various interlocking and driving are enabled. Also, the embodiments may be independently performed with respect to each other, or performed in combination of each other.

Figure 1:
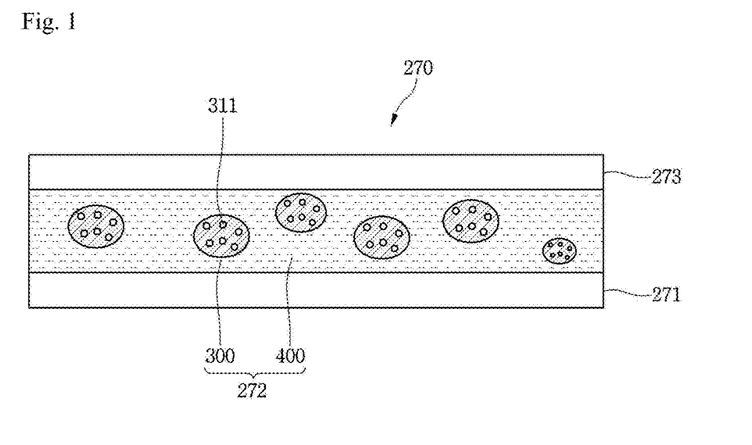
FIG. 1 is a view of a light conversion film according to an embodiment.

FIG. 1 is a view of a light conversion film 270 according to an embodiment. Referring to FIG. 1, the light conversion film 270 according to an embodiment includes a first barrier film 271, a light conversion layer 272, and a second barrier film 273. Here, the light conversion layer 272 includes a matrix resin 400 and a red quantum dot 311 dispersed in the matrix resin 400. Also, the light conversion layer 272 may be formed to satisfy following Equation 1.

$$5 \leq (\text{weight of quantum dot within light conversion layer/total weight of light conversion layer}) \times 100 \times t \leq 50. \quad \text{Equation (1):}$$

Here, in Equation (1), t is a thickness of the light conversion layer, which is measured by a micrometer (μm) unit, particularly, a thickness of only the light conversion layer in the light conversion film. According to studies and experiments conducted by the inventors, if the light conversion film satisfies Equation (1), even though only the red quantum dot is used without using the green quantum dot, superior light emitting efficiency and color characteristic can be realized. However, if the light conversion film does not satisfy Equation (1), the color characteristic may be deteriorated, and thus it may be difficult to realize white light.

Preferably, the light conversion layer 272 may be formed to satisfy the following Equation (2). Equation (2): $0.05 \leq$ (weight of quantum dot within light conversion layer/total weight of light conversion layer)$\times 100 \leq 5$.

If Equation (2) does not satisfy Equation (2), light use efficiency may be deteriorated and thus be uneconomical. Also, the light conversion layer 272 may have a thickness of about 5 μm to about 100 μm, preferably, about 5 μm to about 50 μm. If the thickness of the light conversion layer 272 satisfies the above-described range, the matrix resin is completely cured after the film is formed, or the adhesion and/or physical property is not deteriorated, and thus the light emitting efficiency, color characteristics, and light use efficiency are superior.

Further, the matrix resin 400 is not specifically limited if the matrix resin 400 is a resin in which the quantum dots can be dispersed. For example, the matrix resin may include an acrylic monomer in which the quantum dots are well dispersed, such as of lauryl acrylate, lauryl methacrylate, isobornyl acrylate, and isobornyl methacrylate.

Also, the matrix rein 400 may be a resin having low moisture-permeability and vapor-permeability in aspect of quantum dot degradation prevention. That is, the quantum dot 311 is easily degraded by oxygen or moisture. Thus, to prevent the quantum dot 311 from being degraded, a resin having the low moisture-permeability and vapor-permeability are preferably used as the matrix resin 400 surrounding the quantum dot 311. For example, the matrix resin may include, but is not limited thereto, epoxy, epoxy acrylate, polychlorotri-fluoroethylene, polyethylene, polypropylene, polyvinyl alcohol, and a combination thereof.

The epoxy resin may be a resin having an epoxy group, for example, a bisphenol A resin, a bisphenol F resin, and the like. The epoxy resins may also have low moisture-permeability and/or vapor-permeability due to characteristics of a main chain. The epoxy acrylate resin may be a resin in which an epoxide group of an epoxy resin substitutes for an acrylic group. For example, the epoxy acrylate resin may be one selected from the group consisting of bisphenol A glycerolate diacrylate, bisphenol A ethoxylate diacrylate, bisphenol A glycerolate dimethacrylate, bisphenol A ethoxylate dimethacrylate, and a combination thereof. The epoxy acrylate resin may have low moisture-permeability and vapor-permeability due to the characteristics of the main chain, like the epoxy resin.

Also, the polychloro tri-fluoroethylene may have low moisture and oxygen permeability, the polyethylene and polypropylene may have low moisture permeability, and the polyvinyl alcohol may have low oxygen permeability. As described above, if the matrix resin having the low moisture-permeability and vapor-permeability is used, the degradation of the quantum dot at an edge portion due to the oxygen and moisture can be minimized.

Next, the red quantum dot 311 may be a several nano-sized semiconductor crystal having a quantum confinement effect. Also, light incident into the red quantum dot 311 may be excited and converted into red light, i.e., light having a main peak in a wavelength range of about 600 nm to about 680 nm.

The red quantum dot 310 may be, for example, a particle having a single layer or multi-layered structure including at least one kind of semiconductor crystal selected from the group consisting of CdS, CdO, CdSe, CdTe, $Cd_3P_2$, $Cd_3As_2$, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTE, HgO, HgS, HgSe, HgTe, $HgI_2$, AgI, AgBr, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, $GaInP_2$, InN, InP, InAs, InSb, $In_2S_3$, $In_2Se_3$, $TiO_2$, BP, Si, Ge, and a combination thereof. Here, the red quantum dot 310 may have a diameter of about 1 nm to about 20 nm.

In addition, the red quantum dot 311 may include a capping layer on the surface thereof to prevent the quantum dots from being aggregated with respect to each other. The capping layer may be a ligand layer that is coordinate bonded to the surface of the quantum dot or a surface layer that is coated with a hydrophobic organic molecule.

For example, the capping layer may be a material layer selected from the group consisting of phosphine oxide, organic amine, organic acid, phosphonic acid, which have a long chain alkyl or aryl group, and a combination thereof. For example, the capping layer may be a material layer selected from the group consisting of tri-n-octylphosphine oxide (TOPO), stearic acid, palmitic acid, octadecylamine, dodecylamine, lauric acid, oleic acid, hexyl phosphonic acid, and a combination thereof.

In the current embodiment, the red quantum dot 311 may be dispersed in the form in which the red quantum dot 311 exists in a microphase 300 that exists in the matrix resin 400 as illustrated in FIG. 1. In quantum dots that generally come into the market, hydrophobic ligands may be capped on surfaces of the quantum dots. Thus, the quantum dots may have nonpolarity and thus may not be well dispersed in a resin having high polarity such as an epoxy resin. As a result, media in which the quantum dots are dispersible may be limited. That is, known media in which the quantum dots are capable of being dissolved includes a lauryl (meth) acrylate monomer and an isobonyl (meth) acrylate monomer. Thus, when the quantum dots are mixed with the matrix resin having the low vapor-permeability and moisture-permeability such as the epoxy resin, the quantum dots may not be well dispersed and thus be aggregated with each other. If the quantum dots are aggregated as described above, the light emitted from the light source may be absorbed again through at least two kinds of quantum dots, and thus, the light emitting efficiency may be deteriorated.

Thus, when the matrix resin 400 is used as the resin low vapor-permeability and moisture-permeability, to improve the dispersibility of the quantum dot 311 within the matrix resin, a quantum dot-containing microphase formed by a quantum dot-polymer bead composite or quantum dot-oligomer liquid drop is formed and then dispersed into the matrix resin.

Figure 2:
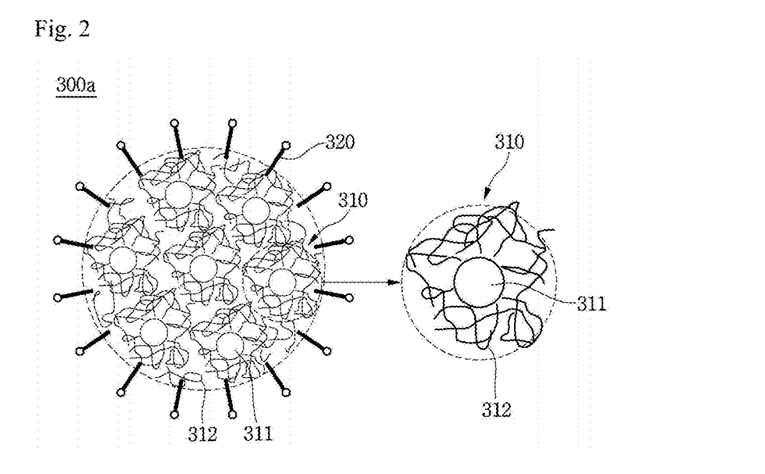
FIG. 2 is a view of a microphase existing in the light conversion film according to an embodiment.

First, a method for forming the light conversion layer 272 by using the quantum dot-polymer bead composite will be described below. In particular, FIG. 2 is a view of the quantum dot-polymer bead composite 300a according to an embodiment. Referring to FIG. 2, the quantum dot-polymer bead composite 300a includes a red quantum dot 311 and a polymer 312 of which a portion of a chain is bonded to a surface of the red quantum dot 311. In more detail, the quantum dot-polymer bead composite 300a has a structure in which a portion of a chain of the polymer 312 includes a plurality of quantum dot-molecule monomers 310 bonded to the surface of the red quantum dot 311 are aggregated.

Here, the polymer bonded to the surface of the red quantum dot 311 may be a polymer having a polar group on a main chain or side chain thereof. For example, the polymer may be a homopolymer or copolymer, which includes at least one kind of material selected from the group of polyester, ethyl cellulose, polyvinylpyridine, and a combination thereof, on the main chain or a polymer, which has at least one kind of polar group selected from the group consisting of —OH, —COOH, —COO, —CO, —O—, and a combination thereof, on the side chain. Alternatively, the polymer may be a partially oxidized polymer such as partially oxidized polyester. Here, the polymer may be a polymer having a solubility parameter of about 19 $Mpa^{1/2}$ to about 24 $MPa^{1/2}$ and a number-average molecular weight of about 300 g/mol to about 100,000 g/mol. A dispersing agent 320 may be attached to a surface of the quantum dot-polymer bead composite 300a.

The quantum dot-polymer bead composite 300a may be manufactured through the following processes, for example, mixing the polymer having a polar group on the main or side chain with a first polar solvent to form a polymer dispersion solution, mixing a quantum dot with a second solvent to form a quantum dot dispersion solution, mixing the polymer dispersion solution with the quantum dot dispersion solution to form a quantum dot-polymer mixed solution, mixing the dispersing agent with a third solvent to form a dispersing agent solution, mixing the quantum dot-polymer mixed solution with the dispersing agent solution to form a bead liquid drop, volatilizing the solvent within the bead liquid drop to form a quantum dot-polymer bead composite, and collecting the quantum dot-polymer bead composite.

Here, the first and second solvents may be equal to or different from each other and be nonpolar solvents. For example, each of the first and second solvents may be tetrahydrofuran (boiling point of about 66° C.), chloroform (boiling point of about 61° C.), cyclohexane (boiling point of about 81° C.), hexane (boiling point of about 68.5° C. to about 69.1° C.), or ethyl acetate (boiling point of about 77.15° C.). Among these, chloroform may be preferable. The third solvent may be a polar solvent. For example, water may be used as the third solvent.

The dispersing agent may maintain the phase separation between the bead-liquid drop and the third solvent and may be an amphiphilic unimolecular or polymer. Also, the dispensing agent may be an ionic dispensing agent or nonionic dispensing agent. For example, the dispensing agent may be polyvinyl alcohol.

As described above, when the quantum dot-polymer mixed solution including the nonpolar solvent and the dispersing agent solution including the polar solvent are mixed with each other, phase separation may occur to form a liquid drop. Here, components of the quantum dot-polymer mixed solution are contained in the liquid drop. Then, when the nonpolar solvent within the liquid drop is volatilized, only the components of the quantum dot and polymer may remain to form the quantum dot-polymer bead composite. Here, when a solvent having a relatively low boiling point is used as the nonpolar solvent, the nonpolar solvent may be decompressed at room temperature without performing a separate heating process to volatilize the solvent.

Figure 3:
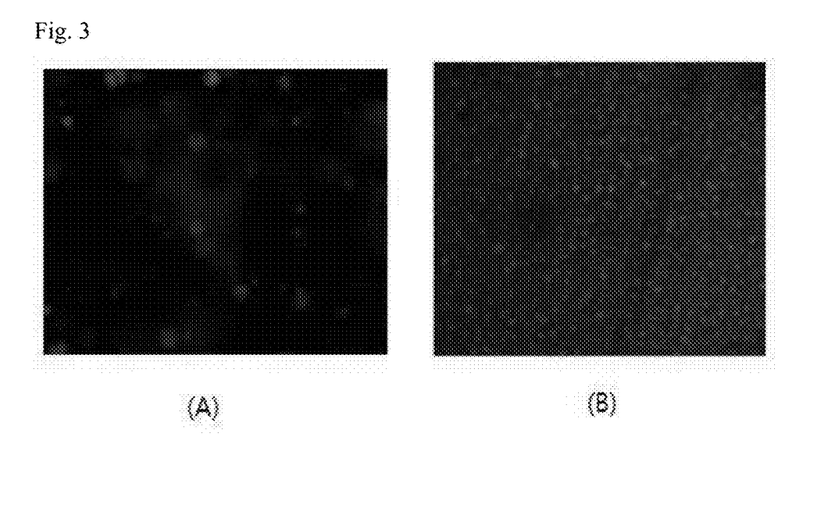
FIG. 3 includes photographs obtained by photographing the light conversion film by using a confocal microscope according to an embodiment.

When the quantum dot-polymer bead composite is formed through above-described processes, the quantum dot-polymer bead composite can be collected by using a filtering device, and then the collected quantum dot-polymer bead composite can be cleaned several times by using ethanol and water and then dried. Then, the quantum dot-polymer bead composite 300a formed as described above can be mixed with the matrix resin solution and then applied to a barrier film and cured to form the light conversion layer 272 in which the microphase 300 is dispersed. In particular, FIG. 3(A) is a photograph of the light conversion film, which is prepared through above-described method, by using a confocal microscope.

Next, a method for forming the light conversion layer 272 by using a quantum dot-oligomer liquid drop will be described. First, oligomer having polar moiety and nonpolar moiety, a nonpolar acrylate monomer, and a quantum dot dispersion solution containing the red quantum dot are prepared.

Here, the oligomer having the polar moiety and the nonpolar moiety may be provided as the form of a block copolymer in which a block including the polar moiety and a block including the nonpolar moiety are bonded to each other, the form of a random copolymer in which a repeating unit having the polar moiety and a repeating unit having the nonpolar moiety are randomly bonded to each other, a structure in which the nonpolar moiety exists in a main chain, and the polar moiety exists in a side chain, or a structure in which the polar moiety exists in the main chain, and the nonpolar moiety exists in the side chain. Here, the polar moiety may include at least one kind of polar group selected from the group consisting of —OH, —COOH, —COO—, —CO—, —O—, and a combination thereof, and the nonpolar moiety may be a hydrocarbon chain including carbon and hydrogen.

Next, the nonpolar (meth) acrylate monomer may be a (meth) acrylate monomer in which the quantum dot is capable of being dissolved, for example, a nonpolar (meth) acrylate monomer having more than 10 carbon atoms. In more detail, the nonpolar (meth) acrylate monomer may be at least one kind of material selected from the group consisting of lauryl acrylate, lauryl methacrylate, isobornyl acrylate, and isobornyl methacrylate.

When the quantum dot dispersion solution is prepared, the matrix resin solution is mixed. Here, because the matrix resin solution has the polarity, and the quantum dot dispersion solution has the nonpolarity due to the nonpolar acrylate that is a main component thereof, when the matrix resin solution and the quantum dot dispersion solution are mixed with each other, phase separation may occur to form the quantum dot-oligomer liquid drop including the oligomer having the polar moiety and nonpolar moiety and the nonpolar (meth) acrylate monomer.

As described above, when the resin solution in which the liquid drop is formed is applied to the barrier film and then cured, the light conversion layer 272 in which the microphase 300a including the red quantum dot is dispersed can be obtained. In more detail, while the liquid drop is cured, the red quantum dot, the microphase 300a including a unit that is induced from the oligomer having the polar moiety and nonpolar moiety, and a unit that is induced from the nonpolar (meth) acrylate monomer may be formed. In particular, FIG. 3(B) is a photograph of the light conversion film, which is prepared through above-described method, by using the confocal microscope.

As described above, the light conversion layer 272 formed by using the quantum dot-polymer bead composite or the quantum dot-oligomer liquid drop helps prevent the red quantum dots from being aggregated within the microphase 300 due to the polymer of the bead composite or the oligomer within the liquid drop. Thus, the microphase 300 can be uniformly dispersed into the matrix resin 400 to minimize the aggregation of the quantum dots, thereby effectively restricting the deterioration in light emitting efficiency due to the light reabsorption.

The light conversion layer 272 may also include a photo-initiator. The photo-initiator may initialize the polymerization of the matrix resin. In the current embodiment, known photo-initiators may be used without being limited. For example, at least two kinds of photo-initiators may be mixed. For example, a metal-based initiator, an epoxy-based initiator, an isocyanate-based initiator, or an amine-based initiator may be used as the photo-initiator. In addition, an initiator that comes into the market, for example, Irgacure 184 may be used as the photo-initiator. A content of the photo-initiator may be about 1 wt % to about 15 wt % of the total weight of the light conversion layer 272.

The light conversion layer 272 may further include a light scattering agent for more effectively scatting the excited light and emission light. Here, a content of the light scattering agent may be about 0.1 wt % to about 40 wt %, preferably, about 0.1 wt % to about 20 wt %, more preferably, about 0.5 wt % to about 20 wt % of the total weight of the light conversion layer.

The light scattering agent can exist in the matrix resin or the microphase including the quantum dot. The light scattering agent may include an organic light scattering agent, inorganic light scattering agent, or a combination thereof. An example of the inorganic light scattering agent may be particle including silicon, silica, alumina, $TiO_2$, $ZrO_2$, barium sulfate), ZnO, or a combination thereof, and an example of the organic light scattering agent may include a polymer particle including poly (methylmethacrylate)-based polymer, benzoguanamine-based polymer, or a combination thereof. The inorganic light scattering agent and organic light scattering agent may be used alone or used to be mixed with each other. Alternatively, two kinds of light scattering agents having sizes different from each other may be mixed and then used.

For example, a micro light scattering agent having a diameter of about 0.5 μm to about 10 μm, a nano light scattering agent having a diameter of about 5 nm to about 200 nm, or a combination thereof may be used as the light scattering agent. Here, the micro light scattering agent may cause Mie scattering, i.e., may scatter primary light emitted from the light source and secondary light excited from the quantum dot. A content of the micro light scattering agent may be about 1 wt % to about 40 wt % within the light conversion layer. If the content of the micro light scattering agent gets out of the above-described range, the dispersion of the quantum dot may be interrupted, and contributiveness with respect to the light absorption due to the light scattering agent may increase to deteriorate optical efficiency.

Next, the nano light scattering agent may cause Rayleigh scattering, i.e., may mainly scatter the primary light generated from the light source. A content of the nano light scattering agent may be about 0.1 wt % to about 20 wt % within the light conversion layer. If the content of the nano light scattering agent is out of the above-described range, the dispersion of the quantum dot may be interrupted, and contributiveness with respect to the light absorption due to the light scattering agent may increase to deteriorate optical efficiency.

Figure 4:
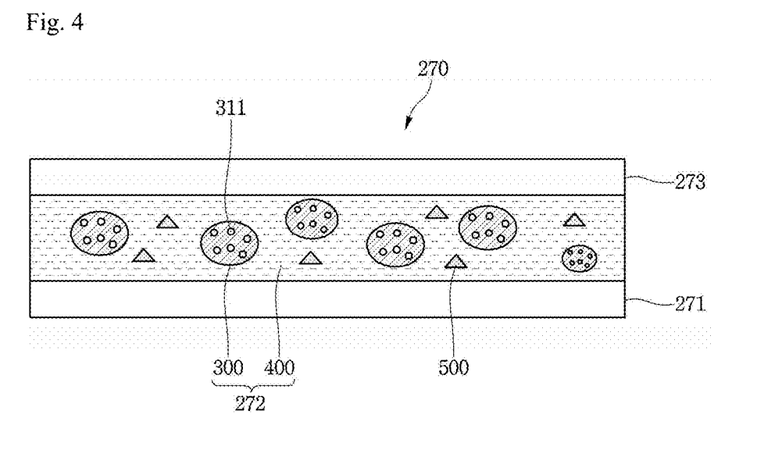
FIG. 4 is a view of a light conversion film according to another embodiment.

As illustrated in FIG. 4, the light conversion layer 272 may further include a green phosphor 500. A green phosphor having high reliability, a low full width at half maximum (FWHM), and less burn-in may be used as the green phosphor 500. In more detail, a green phosphor having an FWHM of about 30 nm to about 10 nm may be used as the green phosphor 500. For example, the green phosphor 500 may include at least one kind of phosphor selected from the group consisting of Beta-SiAlON-based phosphor, an LSN-based phosphor, and LuAG-based phosphor.

As described above, if the light conversion layer 272 further includes the green phosphor, red light can be realized through the red quantum dot, and green light can be realized through the green quantum dot. Also, because the green phosphor is not sensitive to external environments, unlike the green quantum dot, the light conversion film using the green phosphor can have relatively superior reliability when compared to the related art light conversion film.

Next, the first barrier film 271 and the second barrier film 273 support and protect the light conversion layer 272. In more detail, the first and second barrier films 271 and 273 prevent moisture or oxygen in external air from being permeated into the light conversion layer 72, thereby preventing the quantum dots from degrading.

For this, the first and second barrier films 271 and 273 may include a single material or composite material for blocking the introduction of the moisture and/or oxygen. For example, the first and second barrier films 271 and 273 may include a polymer having a high blocking property with respect to the moisture and/or oxygen, for example, polyethylene, polypropylene, polyvinyl chloride, polyvinyl alcohol, ethylene vinylalcohol, polychlorotriplefluoroethylene, polyvinylidene chloride, nylon, polyamino ether, and cycloolefin-based homopolymer or copolymer.

In FIG. 4, each of the first and second barrier films 271 and 273 are provided as a single layer, but is not limited thereto. For example, the first and second barrier films 271 and 273 may be provided as a multilayer. In more detail, each of the first and second barrier films 271 and 273 may include a protection film stacked on a base material is stacked.

In addition, the first and second barrier films 271 and 273 may include an inorganic film or organic-inorganic hydride film having a high blocking property with respect to the moisture and/or oxygen is applied to the base material. Here, the inorganic film or organic-inorganic hydride film may be formed of oxide such as Si, Al, and the like or nitride as a main component. In this instance, a polymer film having high light transmittance and heat-resistance may be used as the base material. For example, a polymer film including polyethylene terephthalate (PET), polyethylene naphthalate (PEN), cyclic olefin copolymer (COC), cyclic olefin polymer (COC), and the like may be used as the base material.

Each of the first and second barrier films 271 and 273 may have a moisture-permeation rate of about $10^{-1}$ g/m²/day to about $10^{-5}$ g/m²/day under a temperature of about 37.8° C. and relative humidity of about 100% and a moisture-permeation rate of about $10^{-1}$ cc/m²/day/atm to $10^{-2}$ cc/m²/day/atm under a temperature of about 23° C. and relative humidity of about 0%. Also, each of the first and second barrier films 271 and 273 may have a linear permeation rate of about 88% to about 95% in a visible ray region of about 420 nm to about 680 nm. In addition, each of the first and second barrier films 271 and 273 may have a thickness of about 20 µm to about 100 µm.

The light conversion film 270 converts incident light into red light having a wavelength band of about 600 nm to about 680 nm. In more detail, when an emission peak is measured after excitation light having a wavelength of about 420 nm is irradiated onto the light conversion film 270, the emission peaks exist in a wavelength band of about 400 nm to about 450 nm and a wavelength band of about 600 nm to about 680 nm.

When the light conversion layer additionally includes the green phosphor, the light conversion film 270 converts incident light into red light having a wavelength band of about 600 nm to about 680 nm and green light having a wavelength band of about 500 nm to about 550 nm. In this instance, when an emission peak is measured after the excitation light having a wavelength of about 420 nm is irradiated onto the light conversion film 470, the emission peaks exist in a wavelength band of about 400 nm to about 450 nm, a wavelength band of about 500 nm to about 550 nm, and a wavelength of about 600 nm to about 680 nm. Here, the emission peaks can be measured by using a wavelength spectrum measuring instrument.

Also, the light conversion film 270 that satisfies Equation (1) has superior color characteristics. In more detail, the light conversion film 270 according to an embodiment is disposed on a light emitting diode (LED) package including Beta-SiAlON-based green phosphor and a blue LED. Then, when color characteristics are measured by using a CIE coordinate system after two sheets of prism films (BFE, 3M company) and brightness enhancement film (DBEF, 3M company) are disposed on the light conversion film, an x value may be about 0.255 to about 0.355, and a y value may be about 0.255 to about 0.355. When the light conversion film according to an embodiment is used, white light having superior color sense is produced.

The light conversion film 270 also has superior light conversion efficiency, which is expressed by the following Equation (3), of about 50% to about 70%, more preferably, about 60% to about 70%.

$$\text{Light conversion efficiency} = \{\text{amount of red light emitted from light conversion film/total amount of light absorbed into light conversion film}\} \times 100. \qquad \text{Equation (3)}$$

Here, the light conversion efficiency can be measured by calculating photon numbers of light emitted from the light conversion film to photon numbers of light absorbed into the light conversion film by using an absolute PL quantum yields measurement system after excitation light having a wavelength of about 420 nm is irradiated.

Also, in the light conversion film 270 according to an embodiment, because the resin having low moisture-permeability and/or vapor-permeability is used as the matrix resin 410, the degradation at an edge portion of the film under high-temperature high-humidity environments is significantly reduced. Particularly, the light conversion film according to an embodiment may have a damaged length of about 2 mm or less, preferably, about 1 mm or less after at the edge portion when a variation at the edge portion is measured after leaving the light conversion film for ten days under conditions of a temperature of about 60° C. and relative humidity of about 90%.

Figure 5:
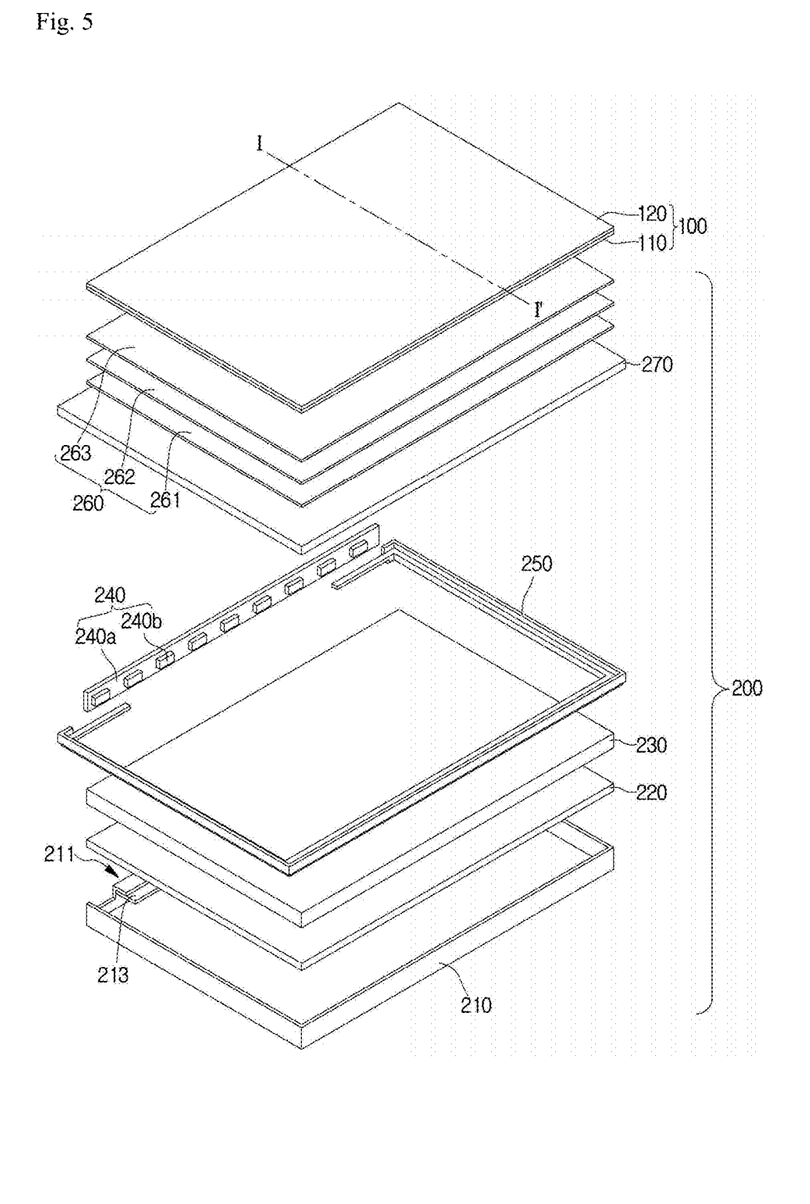
FIG. 5 is a perspective view of a display device according to an embodiment.
Figure 6:
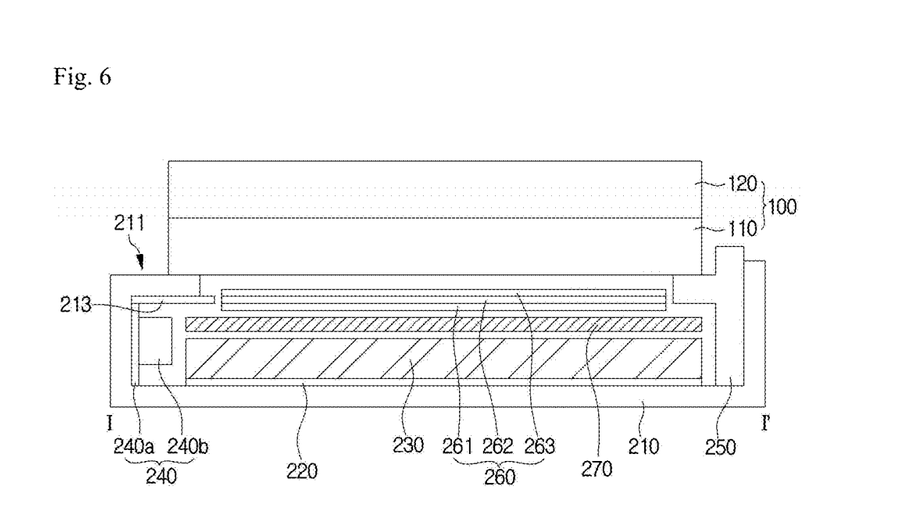
FIG. 6 is a cross-sectional view taken along line I-I' of FIG. 5.

Next, a backlight unit and display device according to an embodiment will be described below. In particular, FIGS. 5 and 6 are views of a display device according to an embodiment. As illustrated in FIGS. 5 and 6, the display device according to an embodiment includes a backlight unit 200 and a display panel 100.

Here, the backlight unit 200 provides light to the display panel 100. Thus, the backlight unit 200 includes a light source unit 240 and the light conversion film 270 according to an embodiment. Also, the backlight unit 200 may further include a bottom case 210, a reflection plate 220, a light guide plate 230, a guide panel 250, and an optical sheet 260. Because the detailed descriptions with respect to the light conversion film 270 are previously described, only other components of the backlight unit will be described.

First, the light source unit 240 provides light to the display panel 100 and be disposed within the bottom case 210. For example, the light source unit 240 includes a plurality of light sources 240*b* and a printed circuit board 240*a* on which the plurality of light sources 240*b* are mounted. Alternatively, the plurality of light sources 240*b* may include a blue light source for emitting blue light and a green light source for emitting green light. For example, the plurality of light sources 240*b* may include blue LEDs and green LEDs alternately arranged.

Figure 7:
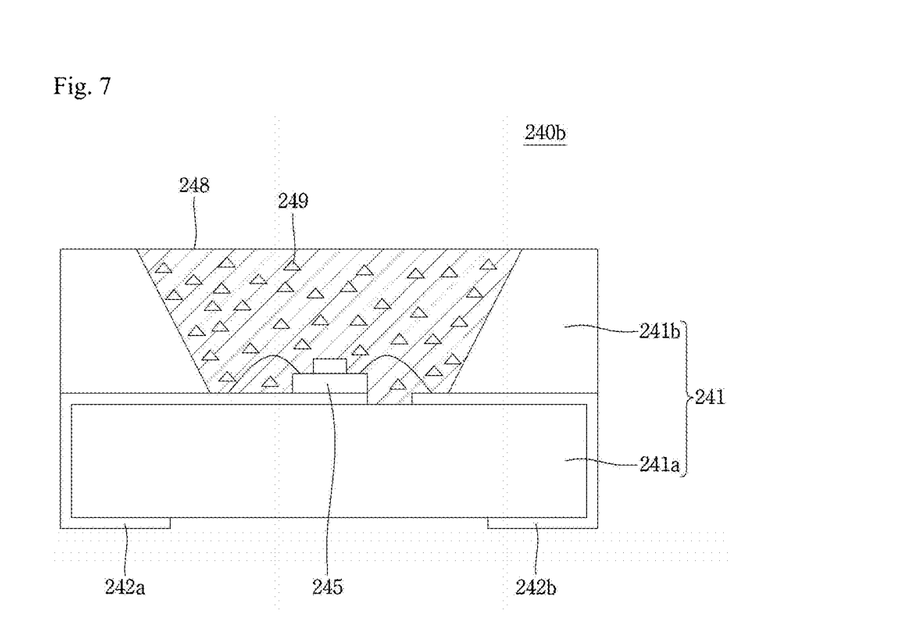
FIG. 7 is a view of a light source provided in a backlight according to an embodiment.

Alternatively, the light source 240*b* may be an LED package including a green phosphor and a blue LED. FIG. 7 is a view of an LED package usable according to an embodiment. Referring to FIG. 7, the LED package 240*b* may include a package board 241, a blue LED 245 mounted on the package board 241, and a transparent resin layer 248 containing green phosphor particles 249.

The package board 241 may include a lower package board 241*a* on which lead frames 242*a* and 242*b* are disposed and an upper package board 241*b* having an inner sidewall that is inclined upward. Electrode parts respectively connected to both electrodes of the blue LED 245 may be connected to upper ends of the lead frames 242*a* and 242*b* through wires, respectively. Here, the green phosphor 249 may include at least one kind of phosphor selected from the group consisting of Beta-SiAlON-based phosphor, an LSN-based phosphor, and LuAG-based phosphor, and the transparent resin layer 248 may include an epoxy resin, a silicon resin, or a combination thereof. However, the LED package in an embodiment is not limited to that illustrated in FIG. 7. For example, various LED packages including blue LEDs and green phosphor particles may be used without being limited.

Alternatively, each of the light sources 240*b* may be a blue light source that emits blue light. For example, the light source 240*b* may be a blue light emitting diode. In this instance, as illustrated in FIG. 4, a light conversion film including green phosphor may be used as the light conversion film.

The printed circuit board 240*a* is electrically connected to the light source 240*b*. The light source 240*b* receives a driving signal through the printed circuit board 240*a* and is thus driven. The printed circuit board 240*a* may have a mount surface on which the light source 240*b* is mounted and an adhesion surface facing the mount surface. The adhesion surface of the printed circuit board 240*a* is attached to the bottom case 210. The printed circuit board 240*a* may also have a bar shape and be disposed on one side of the bottom case 210.

Although the printed circuit board 240*a* is attached to an inner surface of the bottom case 210 in the drawing, it is not limited thereto. For example, the printed circuit board 240*a* may be attached to an inner top surface of the bottom case 210 or a lower surface of a bent extending part 211 of the bottom case 210.

Although the light source unit 240 is disposed on one side of the bottom case 210 in the drawing, it is not limited thereto. For example, the light source unit 240 may be disposed on each of both sides facing each other within the bottom case 210. Also, although an edge type backlight unit 200 is illustrated in the drawing, a direct type backlight unit 200 may be provided. That is, the light source unit 240 may be disposed on the inner top surface of the bottom case 210.

As shown in FIGS. 5 and 6, the bottom case 210 may have an opened upper portion. Also, the bottom case 210 may have a side wall that extends in a closed-loop shape to accommodate the light emitting unit 240, the light guide plate 230, the reflection plate 220, the optical sheet 260, and the light conversion film 270.

Here, at least one sidewall of the bottom case 210 may include a bent extending part 211 that is bent to extend from an upper edge, thereby covering the light source unit 240. That is, one side of the bottom case 210 may have a "⊏"-shaped cross-section. Here, a reflection member 213 may be further disposed on a bottom surface of the bent extending part 211.

The reflection member 213 may be a light source housing, a reflection film, or a reflection tape. The reflection member 213 prevents light emitted from the light source unit 240 from being directly emitted to the display panel 100. Also, the reflection member 213 increases an amount of light incident into the light guide plate 230. Thus, the reflection member 213 improves the light efficiency, brightness, and image quality of the display device.

In the bottom case 210, the bent extending part 211 may be omitted. That is, the bottom case 210 may have one side cross-section with "⌐" shape. The bottom case 210 is coupled to the guide panel 250. The guide panel 250 includes a protrusion therein. The display panel may be seated on and supported by the protrusion of the guide panel 250. The guide panel 250 may be called a support main or mold frame.

The guide panel 250 may be disposed to surround an edge of the backlight unit 200 so as to be bonded to the display panel 100. That is, the guide panel 250 has a frame shape. For example, the guide panel 250 may have a rectangular frame shape. Also, the guide panel 250 may have an opening in an area of the bottom case 210 corresponding to the bent extending part 211.

In addition, each of the bottom case 210 and the guide panel 250 may have a hook shape or include a protrusion or recessed part so that they are assembled with and coupled to each other. Also, the bottom case 210 and the guide panel 250 may adhere to each other by using an adhesive. However, although not limited to the drawing, the guide panel 250 may be disposed on the light source unit 240. Here, the reflection member 213 may be disposed on the bottom surface of the guide panel 250 corresponding to the light source unit 240.

Next, the light guide plate 230 uniformly guides light provided from the light source unit 240 to a liquid crystal display panel 100 through total reflection, refraction, and scattering. Here, the light guide plate 230 is accommodated into the bottom case 210.

Although the light guide plate 230 has a predetermined thickness in the drawing, it is not limited to the shape of the light guide plate 230. For example, the light guide plate 230 may have a thickness that is slightly thinner than that of both sides or a central portion of the light guide plate 230 to reduce the total thickness of the backlight unit 200. Also, the more the light guide plate 230 has a thickness that gradually decreases, the more the light guide plate 230 is away from the light source unit 240.

Also, one surface of the light guide plate 230 may have a specific pattern shape to supply uniform surface light. For example, the light guide plate 230 may have various patterns such as an elliptical pattern, polygonal pattern, hologram pattern, and the like to guide the incident light inward.

Although the light source unit 240 is disposed on a side surface of the light guide plate 230 in the drawing, but is not limited thereto. The light source unit 240 may be disposed to correspond to at least one surface of the light guide plate 230. For example, the light guide unit 240 may be disposed to correspond to one side surface or both side surfaces of the light guide plate 230. Alternatively, the light guide unit 240 may be disposed to correspond to a bottom surface of the light guide plate 230.

The reflection plate 220 may be disposed in a traveling path of light emitted from the light source unit 240. In more detail, the reflection plate 220 is disposed between the light guide plate 230 and the bottom case 210. That is, the reflection plate 220 is disposed under the light guide plate 230. The reflection plate 220 may reflect light traveling onto a top surface of the bottom case 210 toward the light guide plate 230 to improve light efficiency.

Unlike the drawing, if the light source unit 240 is disposed to correspond to the bottom surface of the light guide plate 230, the reflection plate 220 may be disposed on the light source unit 240. In more detail, the reflection plate 220 is disposed on the printed circuit board 240*a* of the light source unit 240. Also, the optical member 220 may have a plurality of holes to which the plurality of light sources 240 are coupled.

That is, the plurality of light sources 240*b* may be inserted into the plurality of holes of the reflection plate 220, and also the light sources 240 may be exposed to the outside. Thus, the reflection plate 220 may be disposed on a side of the light source 240*b* on the printed circuit board 240*a*.

Further, as shown in FIGS. 5 and 6, the optical sheet 260 is disposed on the light guide plate 230 to diffuse and collect light. For example, the optical sheet 260 may include a diffusion sheet 261, a first prism sheet 262, and a second prism sheet 263. The diffusion sheet 261 is disposed on the light guide plate 230. The diffusion sheet 261 improves the uniformity of light that is transmitted therethrough. The diffusion sheet 261 may include a plurality of beads.

In addition, the first prism sheet 262 is disposed on the diffusion sheet 261. The second prism sheet 263 is disposed on the first prism sheet 262. The first and second prism sheets 262 and 263 increase the linearity of light that is transmitted therethrough. Thus, the light emitted onto the light guide plate 230 can pass through the optical sheet 260 and thus be processed into surface light having high brightness.

The light conversion film 270 may be disposed between the optical sheet 260 and the light guide plate 230. Although the backlight unit is described with reference to the accompanying drawings, the backlight unit according to an embodiment is not limited to the above-described backlight unit. That is, in the backlight unit according to an embodiment, a portion of the components in the drawings may be omitted or modified, and also, an additional component may be further provided.

Next, the display panel 100 can realize an image and be, for example, a liquid crystal display panel (LCD). For example, the display panel 100 includes a first substrate 110 and a second substrate 120 which are bonded to each other with a liquid crystal layer therebetween. Also, a polarizing plate for selectively transmitting only specifically polarized light may be further disposed on an outer surface of each of the first and second substrates 110 and 120. That is, a polarizing plate may be disposed on each of a top surface of the first substrate 110 and a bottom surface of the second substrate 120.

In addition, the display panel includes a display area and a non-display area. A gate line and data line are disposed on one surface of the first substrate 110 on the display area. The gate line and the data line may perpendicularly cross each other with a gate insulation layer therebetween to define a pixel area.

The first substrate 110 may be a thin film transistor substrate. A thin film transistor may be disposed on an intersection area between the gate line and the data line on one surface of the first substrate 110. That is, the thin film transistor is disposed on the pixel area. Also, a pixel electrode is disposed on each of pixel areas on one surface of the first substrate 110. The thin film transistor and the pixel electrode are electrically connected to each other.

The thin film transistor includes a gate electrode, a semiconductor layer, a source electrode, and a drain electrode. The gate electrode is branched from the gate line. Also, the source electrode may be branched from the data line. The pixel electrode may be electrically connected to the drain electrode of the thin film transistor.

In addition, the thin film transistor includes a bottom gate structure, a top gate structure, or a double gate structure. That is, the thin film transistor may be various changed and modified without departing from the spirit and scope of the embodiment.

The second substrate 120 may be a color filter substrate. A black matrix having a lattice shape that covers the non-display area such as the thin film transistor formed on the first substrate 110 and surrounds the pixel area may be disposed on one surface of the second substrate 120 of the display panel 100. Also, a red color filter layer, a green color filter layer, and a blue color filter layer that are successively repeatedly arranged to correspond to each of the pixel areas may be disposed in the lattice.

Also, the display panel 100 includes a common electrode that generates electrical fields with the pixel electrode so as to drive the liquid crystal layer. A method for arranging the liquid crystal molecules may include a twisted nematic (TN) mode, a vertical alignment (VA) mode, an in plane switching (IPS) mode, or fringe field switching (FFS) mode. The common electrode may be disposed on the first or second substrate 110 or 120 according to the arrangement method of the liquid crystal molecules.

Also, the display panel 100 may include a color filter on transistor (COT) structure in which the thin film transistor, the color filter layer, and the black matrix are formed on the first substrate 110. The second substrate 120 is bonded to the first substrate 110 with the liquid crystal layer therebetween. That is, the thin film transistor may be disposed on the first substrate 110, and the color filter layer may be disposed on the thin film transistor. Here, a protection film may be disposed between the thin film transistor and the color filter layer.

Also, a pixel electrode contacting the thin film transistor is disposed on the first substrate 110. Here, the black matrix may be omitted to improve an aperture ratio and simplify a masking process. Thus, the common electrode may share the function of the black matrix. In addition, a driving circuit part for supplying a driving signal from the outside is connected to the display panel 100. The driving circuit part may be mounted on the substrate of the display panel 100 or be connected to the display panel 100 through a connection member such as a tape carrier package.

Although the display panel is described with reference to the accompanying drawings, the display panel according to an embodiment is not limited to the above-described display panel. That is, in the display panel according to an embodiment, a portion of the components in the drawings may be omitted or modified, and also an additional component may be further provided.

In the display device according to an embodiment, and coordinate values measured by using the CIE coordinate system may be an x value of about 0.25 to about 0.35 and a y value of about 0.25 to about 0.35. Thus, white light having superior color sense may be realized.

Next, the current embodiment will be described in detail with reference to embodiments. However, the following embodiments are used only for explaining a specific embodiment while not limiting the inventive concept. That is, the present disclosure may be embodied in different forms and should not be construed as limited to the embodiments set forth herein.

Preparation Examples 1 to 5

Isobornyl methacrylate, lauryl acrylate, and a block copolymer having the polar moiety and nonpolar moiety were mixed at a weight ratio of 3:1:1 to form a resin mixed solution. Then, Irgacure 184 was added to the resin mixed solution so that the Irgacure 184 has about 1 weight by part with respect to 100 weight by parts of the mixed solution. Then, InP/ZnS core-shell quantum dot powder was added to the mixture to satisfy wt % that is listed in (Table 1), and the resultant mixture was stirred to prepare a composite for the light conversion layer.

prepare a light conversion film having a light conversion layer having a thickness listed in (Table 2).

The color characteristics and light conversion efficiency of the light conversion films prepared as described above were measured. Here, the light conversion films having the above-described color characteristic was disposed on an LED package including Beta-SiAlON-based green phosphor and a blue LED, and then two sheets of prism films (BFE, 3M company) and brightness enhancement film (DBEF, 3M company) were disposed on the light conversion films to measure color characteristics by using the CIE coordinate system. Also, the light conversion efficiency was measured by calculating photon numbers of light emitted from the light conversion films to photon numbers of light absorbed into the light conversion films by using an absolute PL quantum yields measurement system after excitation light having a wavelength of about 420 nm is irradiated. The measured results were shown in (Table 2) below.

Also, after the light conversion films are mounted on the display device as illustrated in FIG. 5. Color characteristics were measured by using the CIE coordinate system. The measured results were shown in (Table 2) below.

TABLE 2

|  |  | Light conversion film | | | | | |
|---|---|---|---|---|---|---|---|
|  |  | Light conversion layer thickness | | | Light conversion efficiency | Display device | |
| classification | QD wt % | (μm) | x | y | (%) | x | y |
| Embodiment 1 | 0.5 | 20 | 0.26304 | 0.26964 | 54.9 | 0.25734 | 0.27514 |
| Embodiment 2 | 0.5 | 50 | 0.28084 | 0.27914 | 60.5 | 0.27514 | 0.28464 |
| Embodiment 3 | 2 | 5 | 0.25666 | 0.27914 | 54.9 | 0.27514 | 0.28464 |
| Embodiment 4 | 2 | 10 | 0.27882 | 0.27646 | 63.8 | 0.27312 | 0.28196 |
| Embodiment 5 | 2 | 20 | 0.31524 | 0.29003 | 67.8 | 0.30954 | 0.29553 |
| Embodiment 6 | 5 | 5 | 0.30368 | 0.28578 | 67.9 | 0.29796 | 0.29128 |
| Embodiment 7 | 5 | 10 | 0.31166 | 0.28832 | 68.8 | 0.30596 | 0.29382 |
| Comparative Example 1 | 0.05 | 10 | 0.22468 | 0.24705 | 6.9 | 0.21989 | 0.25255 |
| Comparative Example 2 | 0.05 | 20 | 0.22585 | 0.2483 | 9.3 | 0.22015 | 0.2538 |
| Comparative Example 3 | 0.05 | 50 | 0.23158 | 0.25301 | 21.7 | 0.22588 | 0.25851 |
| Comparative Example 4 | 0.1 | 10 | 0.22724 | 0.24883 | 12.9 | 0.22154 | 0.25433 |
| Comparative Example 5 | 0.1 | 20 | 0.23256 | 0.25234 | 27.9 | 0.22686 | 0.25784 |
| Comparative Example 6 | 0.5 | 5 | 0.23969 | 0.25517 | 39.1 | 0.23399 | 0.26067 |
| Comparative Example 7 | 5 | 50 | 0.42527 | 0.32098 | 60.5 | 0.41957 | 0.32648 |

TABLE 1

|  | QD wt % |
|---|---|
| Preparation Example 1 | 0.05% |
| Preparation Example 2 | 0.1% |
| Preparation Example 3 | 0.5% |
| Preparation Example 4 | 2% |
| Preparation Example 5 | 5% |

Embodiments 1 to 7 and Comparison Examples 1 to 7

The composites prepared according to Preparation Examples 1 to 5 were applied between the first barrier film (film (i-component, 50 μm) and the second barrier film (i-component, 50 μm) and then exposed to the UV rays to Preparation Examples 6 to 10

Isobornyl methacrylate, lauryl acrylate, and a block copolymer having the polar moiety and nonpolar moiety were mixed at a weight ratio of 3:1:1 to form a resin mixed solution. Then, Irgacure 184 and a light scattering agent were added to the resin mixed solution so that the Irgacure 184 and the light scattering agent respectively have about 1 weight by part and about 5 weight by parts with respect to 100 weight by parts of the mixed solution. Then, InP/ZnS core-shell quantum dot powder was added to the mixture to satisfy wt % that is listed in (Table 3), and the resultant mixture was stirred to prepare a composite for the light conversion layer.

TABLE 3

| | QD wt % |
|---|---|
| Preparation Example 6 | 0.05% |
| Preparation Example 7 | 0.1% |
| Preparation Example 8 | 0.5% |

TABLE 3-continued

| | QD wt % |
|---|---|
| Preparation Example 9 | 2% |
| Preparation Example 10 | 5% |

Embodiments 8 to 14 and Comparison Examples 8 to 17

The composites prepared according to Preparation Examples 6 to 10 were applied between the first barrier film (film (i-component, 50 μm) and the second barrier film (i-component, 50 μm) and then exposed to the UV rays to prepare a light conversion film having a light conversion layer having a thickness listed in (Table 4).

The color characteristics and light conversion efficiency of the light conversion films prepared as described above were measured. Here, the light conversion films having the above-described color characteristic was disposed on an LED package including Beta-SiAlON-based green phosphor and a blue LED, and then two sheets of prism films (BFE, 3M company) and brightness enhancement film (DBEF, 3M company) were disposed on the light conversion films to measure color characteristics by using the CIE coordinate system. Also, the light conversion efficiency was measured by calculating photon numbers of light emitted from the light conversion films to photon numbers of light absorbed into the light conversion films by using the absolute PL quantum yields measurement system after excitation light having a wavelength of about 420 nm is irradiated. The measured results were shown in (Table 4) below.

Also, after the light conversion films are mounted on the display device as illustrated in FIG. 5. Color characteristics were measured by using the CIE coordinate system. The measured results were shown in (Table 4) below.

TABLE 4

| | | | Light conversion film | | | Display device | |
|---|---|---|---|---|---|---|---|
| | | Light conversion layer thickness | | | Light conversion efficiency | | |
| Classification | QD wt % | (μm) | x | y | (%) | x | y |
| Embodiment 8 | 0.1 | 50 | 0.27128 | 0.27018 | 46 | 0.26559 | 0.27568 |
| Embodiment 9 | 0.5 | 10 | 0.25655 | 0.26126 | 43.2 | 0.25085 | 0.26676 |
| Embodiment 10 | 0.5 | 20 | 0.29533 | 0.27338 | 58.5 | 0.28963 | 0.27888 |
| Embodiment 11 | 2 | 5 | 0.26008 | 0.26251 | 57.9 | 0.25438 | 0.26801 |
| Embodiment 12 | 2 | 10 | 0.2989 | 0.27376 | 66.3 | 0.2932 | 0.27926 |
| Embodiment 13 | 5 | 5 | 0.30531 | 0.27834 | 68 | 0.29961 | 0.28384 |
| Embodiment 14 | 5 | 10 | 0.33579 | 0.28491 | 72.1 | 0.33009 | 0.29041 |
| Comparative Example 8 | 0.05 | 5 | 0.2261 | 0.24964 | 5.9 | 0.2204 | 0.25514 |
| Comparative Example 9 | 0.05 | 10 | 0.22653 | 0.24802 | 8.9 | 0.22083 | 0.25352 |
| Comparative Example 10 | 0.05 | 20 | 0.2348 | 0.25614 | 16.7 | 0.2291 | 0.26164 |
| Comparative Example 11 | 0.1 | 5 | 0.22919 | 0.25011 | 13.3 | 0.22349 | 0.25561 |
| Comparative Example 12 | 0.1 | 10 | 0.23091 | 0.25214 | 15.1 | 0.22521 | 0.25764 |
| Comparative Example 13 | 0.1 | 20 | 0.24879 | 0.26177 | 33.5 | 0.24309 | 0.26727 |
| Comparative Example 14 | 0.5 | 5 | 0.24651 | 0.25758 | 37.2 | 0.24081 | 0.26308 |
| Comparative Example 15 | 2 | 50 | 0.43177 | 0.29666 | 75.6 | 0.42607 | 0.30216 |
| Comparative Example 16 | 5 | 20 | 0.41243 | 0.29644 | 76.3 | 0.40673 | 0.30194 |
| Comparative Example 17 | 5 | 50 | 0.49496 | 0.30653 | 76.1 | 0.48926 | 0.31203 |

Through (Table 2) and (Table 4), it is seen that the light conversion films of which Equation (1) satisfies a weight of about 5 to about 50 have superior color characteristics and light conversion efficiency. Further, if Equation (1) gets out of the above-described range, it is seen that the color characteristics and/or light conversion efficiency are deteriorated.

In the light conversion film according to the embodiment, only the red quantum dots may be used without using the green quantum dots to reduce the amount of quantum dots within the film, thereby minimizing the deterioration in light efficiency due to the reabsorption of the quantum dots and realizing the superior light conversion efficiency.

Also, when a specific relational expression between the content of the quantum dot within the light conversion layer and the thickness of the light conversion layer is satisfied, the light conversion film that is thin and has superior color characteristic may be achieved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light conversion film comprising:
  a first barrier film;
  a light conversion layer disposed on the first barrier film, the light conversion layer comprising a matrix resin, red quantum dots dispersed into the matrix resin, microphases each including at least the red quantum dots, and a dispersing agent on a surface of the microphases; and
  a second barrier film disposed on the light conversion layer,
  wherein the light conversion film satisfies the following Equation (1):

$$5 \leq (\text{weight of the red quantum dots within the light conversion layer/total weight of light conversion layer}) \times 100 \times t \leq 50 \qquad \text{Equation (1):,}$$

where t is a thickness of the light conversion layer, and wherein the light conversion layer has the thickness t of about 5 μm to about 100 μm.

2. The light conversion film according to claim 1, wherein the light conversion film satisfies Equation (2):

$$0.05 \leq (\text{weight of the red quantum dots within the light conversion layer/total weight of light conversion layer}) \times 100 \leq 5 \qquad \text{Equation (2):.}$$

3. The light conversion film according to claim 1, wherein, when excitation light having a wavelength of about 420 nm is irradiated, the light conversion film has emission peaks in a wavelength band of about 400 nm to about 450 nm and a wavelength band of about 600 nm to about 680 nm.

4. The light conversion film according to claim 1, wherein the microphases include a quantum dot-polymer bead composite or quantum dot-oligomer liquid drop.

5. The light conversion film according to claim 4, wherein the quantum dot-polymer bead composite further includes:
  a polymer of which a portion of a chain is bonded to surfaces of the red quantum dots, the polymer comprising a polar group on a main or side chain thereof.

6. The light conversion film according to claim 4, wherein the quantum dot-oligomer liquid drop further includes:
  oligomer having polar moiety and nonpolar moiety, and
  a nonpolar (meth) acrylate monomer.

7. The light conversion film according to claim 1, wherein the light conversion layer further comprises a light scattering agent.

8. The light conversion film according to claim 7, wherein the light scattering agent has a content of about 0.1 wt % to about 40 wt % of the total weight of the light conversion layer.

9. The light conversion film according to claim 7, wherein the light scattering agent comprises a micro scattering agent having a diameter of about 0.5 μm to about 10 μm, a nano scattering agent having a diameter of about 5 nm to about 200 nm, and a combination thereof.

10. The light conversion film according to claim 9, wherein the micro scattering agent has a content of about 1 wt % to about 40 wt % of the total weight of the light conversion layer.

11. The light conversion film according to claim 9, wherein the nano scattering agent has a content of about 1 wt % to about 20 wt % of the total weight of the light conversion layer.

12. The light conversion film according to claim 1, wherein the light conversion layer further comprises a photo-initiator.

13. The light conversion film according to claim 12, wherein the photo-initiator has a content of about 1 wt % to about 15 wt % of the total weight of the light conversion layer.

14. The light conversion film according to claim 1, wherein the light conversion layer further comprises a green phosphor.

15. The light conversion film according to claim 14, wherein when excitation light having a wavelength of about 420 nm is irradiated, the light conversion film has emission peaks in a wavelength band of about 400 nm to about 450 nm, a wavelength band of about 500 nm to about 550 nm, and a wavelength band of about 600 nm to about 680 nm.

16. The light conversion film according to claim 1, wherein each of the first and second barrier films has a moisture-permeation rate of about $10^{-1}$ g/m$^2$/day to about $10^{-5}$ g/m$^2$/day under a temperature of about 37.8° C. and relative humidity of about 100%.

17. The light conversion film according to claim 1, wherein each of the first and second barrier films has a moisture-permeation rate of about $10^{-1}$ cc/m$^2$/day to about $10^{-2}$ cc/m$^2$/day under a temperature of about 23° C. and relative humidity of about 0%.

18. The light conversion film according to claim 1, wherein each of the first and second barrier films has a thickness of about 20 μm to about 100 μm.

19. The light conversion film according to claim 2, wherein the light conversion film has a light conversion efficiency of about 40% to about 80% that are expressed as following Equation (3):

$$\text{light conversion efficiency} = \{\text{amount of red light emitted from light conversion film/total amount of light absorbed into light conversion film}\} \times 100 \qquad \text{Equation (3):.}$$

20. The light conversion film according to claim 1, wherein after the light conversion film is disposed on a light emitting diode package comprising a green phosphor and a blue light emitting diode, a coordinate value measured by using a CIE coordinate system has an x value of about 0.255 to about 0.355.

21. The light conversion film according to claim 1, wherein, after the light conversion film is disposed on a light emitting diode package comprising a green phosphor and a blue light emitting diode, a coordinate value measured by using a CIE coordinate system has a y value of about 0.255 to about 0.355.

22. A backlight unit comprising:
  a light source unit comprising at least one light source; and
  a light conversion film disposed on the light source unit, wherein the light conversion film comprises:
  a first barrier film;
  a light conversion layer disposed on the first barrier film, the light conversion layer comprising a matrix resin, red quantum dots dispersed into the matrix resin, microphases each including at least the red quantum dots, and a dispersing agent on a surface of the microphases; and
  a second barrier film disposed on the light conversion layer, wherein the light conversion film satisfies following Equation (1):

$$5 \leq (\text{weight of the red quantum dots within the light conversion layer/total weight of light conversion layer}) \times 100 \times t \leq 50 \quad \text{Equation (1):,}$$

where t is a thickness of the light conversion layer, and wherein the light conversion layer has the thickness t of about 5 μm to about 100 μm.

23. The backlight unit according to claim 22, wherein the at least one light source comprises a blue light source and a green light source.

24. The backlight unit according to claim 22, wherein the light source comprises a light emitting diode package comprising a green phosphor and a blue light emitting diode.

25. The backlight unit according to claim 22, wherein the light source comprises a blue light source, and
wherein the light conversion film further comprises a green phosphor in the light conversion layer.

26. A display device comprising:
a display panel; and
a backlight unit disposed under the display panel,
wherein the backlight unit comprises:
a light source unit comprising at least one light source; and
a light conversion film disposed on the light source unit,
wherein the light conversion film comprises:
a first barrier film;
a light conversion layer disposed on the first barrier film, the light conversion layer comprising a matrix resin, red quantum dots dispersed into the matrix resin, microphases each including at least the red quantum dots, and a dispersing agent on a surface of the microphases; and
a second barrier film disposed on the light conversion layer,
wherein the light conversion film satisfies following Equation (1):

$$5 \leq (\text{weight of the red quantum dots within the light conversion layer/total weight of light conversion layer}) \times 100 \times t \leq 50 \quad \text{Equation (1):,}$$

where t is a thickness of the light conversion layer, and wherein the light conversion layer has the thickness t of abut 5 μm to about 100 μm.

27. The display device according to claim 26, wherein in the display device, a coordinate value measured by using a CIE coordinate system has an x value of about 0.255 to about 0.355.

28. The display device according to claim 26, wherein in the display device, a coordinate value measured by using a CIE coordinate system has a y value of about 0.255 to about 0.355.

* * * * *